US008693972B2

(12) United States Patent
Forman et al.

(10) Patent No.: US 8,693,972 B2
(45) Date of Patent: Apr. 8, 2014

(54) DOWN-CONVERSION OF MULTIPLE RF CHANNELS

(71) Applicant: ESS Technology, Inc, Fremont, CA (US)

(72) Inventors: Dustin Dale Forman, Kelowna (CA); A. Martin Mallinson, Kelowna (CA); Robert Lynn Blair, Los Altos, CA (US)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 13/668,253

(22) Filed: Nov. 3, 2012

(65) Prior Publication Data

US 2013/0115906 A1 May 9, 2013

Related U.S. Application Data

(60) Provisional application No. 61/555,781, filed on Nov. 4, 2011, provisional application No. 61/670,238, filed on Jul. 11, 2012.

(51) Int. Cl.
*H04B 3/16* (2006.01)
*H04B 15/00* (2006.01)

(52) U.S. Cl.
USPC ........... 455/313; 455/314; 455/323; 375/152; 375/350

(58) Field of Classification Search
USPC .................. 455/130–131, 313–314, 323; 375/147–150, 152, 346, 350
See application file for complete search history.

(56) References Cited

U.S. PATENT DOCUMENTS

| | | | | |
|---|---|---|---|---|
| 6,161,086 A * | 12/2000 | Mukherjee et al. | ........... | 704/207 |
| 6,718,355 B2 * | 4/2004 | Felts et al. | ..................... | 708/319 |
| 7,028,070 B2 * | 4/2006 | Mallinson | ..................... | 708/819 |
| 7,965,761 B2 | 6/2011 | Shattil | | |
| 8,001,172 B2 | 8/2011 | Mallinson | | |
| 2003/0058976 A1 * | 3/2003 | Ohta et al. | ..................... | 375/350 |
| 2003/0212947 A1 * | 11/2003 | Schenk et al. | ................ | 714/786 |
| 2004/0037380 A1 * | 2/2004 | Shan | ............................. | 375/346 |
| 2006/0056496 A1 * | 3/2006 | Smee et al. | ..................... | 375/148 |
| 2008/0315940 A1 * | 12/2008 | Yamamoto | ..................... | 327/355 |
| 2010/0159858 A1 * | 6/2010 | Dent et al. | ..................... | 455/131 |
| 2010/0328125 A1 * | 12/2010 | Pagnanelli | ..................... | 341/143 |
| 2011/0313760 A1 * | 12/2011 | Ricci et al. | ..................... | 704/211 |
| 2012/0134407 A1 * | 5/2012 | Bhoja et al. | ..................... | 375/233 |
| 2012/0136653 A1 * | 5/2012 | Oshikiri et al. | ............... | 704/203 |
| 2012/0300888 A1 * | 11/2012 | Mallinson et al. | ............ | 375/349 |
| 2013/0054663 A1 * | 2/2013 | Aravind et al. | ............... | 708/300 |
| 2013/0279633 A1 * | 10/2013 | Morris et al. | ................. | 375/324 |

FOREIGN PATENT DOCUMENTS

WO 2011/069229 A1 6/2011

* cited by examiner

*Primary Examiner* — Simon Nguyen
(74) *Attorney, Agent, or Firm* — Gard & Kaslow LLP

(57) ABSTRACT

A method and system is disclosed for designing a radio for down-converting RF signals to IF signals by sampling the signals in a round-robin sampling circuit and multiplying the samples by coefficients that are changed at a fixed rate equal to the rate of operation of each of the sampling circuits. The circuit is able to down-convert multiple channels simultaneously to adjacent positions in the IF band, while rejecting unwanted image signals. The method and system avoids the difficulty and cost of directly digitizing the RF signal, allowing each component to operate at a greatly reduced speed. The coefficients are selected to provide the desired transfer function while keeping the output signal centered at a desired frequency.

19 Claims, 13 Drawing Sheets

DOWN-CONVERSION OF MULTIPLE RF CHANNELS

This application claims priority from Provisional Applications Nos. 61/555,781, filed Nov. 4, 2011, and 61/670,238, filed Jul. 11, 2012, which are incorporated by reference in their entirety.

FIELD OF THE INVENTION

The present invention relates generally to radio frequency signals, and more particularly to the conversion of radio frequency signals to lower intermediate frequency signals.

BACKGROUND OF THE INVENTION

The radio frequency (RF) band of the electromagnetic spectrum contains frequencies from approximately 3 kilohertz (3,000 hertz, or 3 kHz) to 300 gigahertz (GHz). In many places, the use of this band is regulated by the government. For example, in the United States, the broadcast television system is disseminated via radio transmissions on designated channels in the band from 54 megahertz (MHz) to 890 MHz. There are two radio frequencies at which satellites broadcast signals in the Global Positioning System (GPS); L1 signals are broadcast at 1.57542 GHz, and L2 signals at 1.2276 GHz.

Some radio receivers, such as super-heterodyne receivers, operate by converting a high RF signal to a signal of a lower frequency, often referred to as an intermediate frequency (IF) by mixing the RF signal with a mixing signal of a different frequency, to allow for more convenient amplification and selection of the desired channel. The difference between the frequencies of the RF signal and the mixing signal is the frequency of the IF signal. (As used herein, a receiver that receives any signal in the RF band is a radio receiver, even if the signal is a television or GPS signal as above.) Signals in the television spectrum may be down-converted so that, for example, an RF signal in the 500 MHz to 506 MHz region (which is TV channel 19) may be down-converted to an IF signal at 41 MHz to 47 MHz. Other television signals, or the GPS signals described above, may be similarly down-converted. Application of gain and selection of the channel to be received can thus occur in the IF frequencies, which are more easily operated upon than the higher RF frequencies.

In modern radio receivers, frequency selection and data recovery is performed by converting the down-converted IF signal into the digital domain. An analog-to-digital converter (ADC) is used to transform the analog IF signal into a digital data stream after which sophisticated digital signal processing (DSP) techniques can be used to recover from noise, dropout and similar artifacts of a digital radio system.

It is known to be desirable to move as much of the receiver into the digital domain if possible, as this would allow all receiver features such as channel selection and protocol implementation to be done digitally, at lower cost and with higher performance than is currently available. Thus, for example, the idea that the RF signal itself could be converted with either a conventional finite impulse response (FIR) filter or a high speed ADC appears to be attractive.

However, as is known in the art, to convert an analog signal to a digital signal, an ADC must sample the analog signal at a rate at least twice as fast as the signal itself. Thus, to achieve such direct conversion of an RF signal with a frequency of 1.25 GHz (including all signals of lower frequencies) would require at least 2.5 giga-samples per second (GS/s), or one sample every 400 picoseconds (pS). This would require a conventional FIR filter to pass samples from one sample-and-hold amplifier (SHA) to the next with a transit time of much less than 50 pS per stage; further, as will be understood by one of skill in the art, to allow each stage to settle to 60 db, or one part per thousand, implies a bandwidth of about 22 GHz.

Alternatively, a high speed ADC operating at a frequency of at least 2.5 GS/s would similarly be sufficient to convert a 1.25 GHz signal. Such high speed ADCs consume a large amount of power. Further, the data emerging from such an ADC is at an exceptionally high rate, since each sample must contain a desired number of bits and the total output rate is the sampling rate times the number of bits per sample. Thus, a 12 bit ADC running at 2.5 GS/s outputs about 30 gigabits per second (GB/s), a large amount of data to transport and process.

Further, as is known in the art, a conventional heterodyne receiver which down-converts by mixing a RF signal with a lower frequency signal has an "image problem." Suppose a 500 MHz signal is down-converted to one at 5.2 MHz by mixing the 500 MHz signal with one at 494.8 MHz (the IF signal is the difference between 500 MHz and 494.8 MHz, i.e., 5.2 MHz). There will also be the down-conversion of an "image" signal; a signal having a frequency of 489.6 MHz will also be down-converted to 5.2 MHz, since just as 500 MHz less 498.8 MHz equals 5.2 MHz, so too does 494.8 MHz less 489.6 MHz equal 5.2 MHz.

Both 500 MHz and 489.6 MHz thus down-convert to 5.2 MHz, which creates a problem, since once converted the two signals cannot be separated. The second, unwanted signal is referred to as the "image," since it includes the signal at the frequency (here 489.6 MHz) that is the same distance from the local frequency of 494.8 MHz as the desired 500 MHz signal, and thus the "mirror image" of the desired signal. To be useful, a radio must be able to provide "image rejection," i.e., to be able to reject the unwanted image frequency.

A known method of image rejection is known as the Weaver architecture. A circuit 100 using this architecture is shown in FIG. 1; it uses two sets of multipliers, each set called a "quadrature modulator" because it multiplies the signal by a local oscillator that has two outputs that are in quadrature to each other, i.e., 90 degrees apart in phase. There are four multipliers 101, 102, 103 and 104, and two low pass filters 105 and 106.

The RF signal is divided into two paths; on one path the signal is multiplied by sine waves at a first frequency by multiplier 101 and at a second frequency by multiplier 103; in between is a low pass filter 105. On the other path, multipliers 102 and 104 multiply the signal by cosine waves at the same two frequencies, again separated by an identical low pass filter 106.

(It will be apparent to one of skill in the art that it is common to refer to a single "multiplier" that multiplies an input signal by some function, for example, a sine or cosine wave, when what is really meant is a plurality of multipliers that each receive time-separated samples of the signal and coefficients, such that the sum of the outputs of the plurality of multipliers is the input signal multiplied by the function, i.e., the desired sine or cosine wave. FIG. 1 shows such a single multiplier, as do other figures herein. One of skill in the art will understand when a multiplier being discussed is intended to be so representative of a plurality of multipliers. The sampling circuits, such as sample and hold amplifiers (SHAs), are also not shown in FIG. 1.)

The two frequencies are selected so that the net result is to down-convert the incoming RF signal by the desired amount; the first multipliers 101 and 102 down-convert the RF signal part of the way, and the partially down-converted intermediate signal is filtered. The second multipliers 103 and 104 down-convert the signal the rest of the way to a desired frequency, resulting in an IF signal. The low pass filters are selected to filter the intermediate signal so that the upper of the mixed frequencies is removed, and only the difference frequency $F_{REC}-F_{LO}$ between the received frequency $F_{REC}$ and the local oscillator frequency $F_{LO}$ is passed to the second set of multipliers 103 and 104, while the sum frequency $F_{REC}+F_{LO}$ is removed. Thus, there can be no image present in the IF output. Any direct conversion of an RF circuit into the digital domain must also provide for such image rejection and thus implement such a Weaver architecture or a functional equivalent digitally.

Despite the potential difficulties of sampling at such high speeds, large amounts of resulting data, and image rejection, the ability to directly sample and convert the RF signal remains very attractive. If such direct conversion could be done, and signals originally widely separated in frequency down-converted to a more narrow range, a programmable device could function as a flexible multi-purpose radio receiver controlled entirely by software, and without needing any frequency-specific elements. Such a "software defined radio" or SDR could potentially operate on multiple channels at the same time. For example, in such a case the receiver could decode digital TV on channel 19, while at the same time decoding the GPS position and receiving digital data from a 2.4 Ghz signal.

SUMMARY OF THE INVENTION

A method and system is disclosed for down-converting RF signals to IF signals by sampling the signals in a round-robin FIR filter in which the coefficients of the filter are changed at a fixed rate. The radio is able to reject unwanted image signals and to down-convert multiple channels simultaneously.

In one embodiment is a computer implemented method of down-converting an input signal from a first frequency band to a second frequency band, comprising: receiving in a processor a selected transfer function for the circuit, including a center frequency of the second frequency band; calculating in the processor a first set of scaling factors corresponding to the coefficients in a Fourier series approximation of the desired transfer function; multiplying in the processor the first set of scaling factors by a window function; calculating in the processor a plurality of additional sets of scaling factors based on the first set of scaling factors, each additional set of scaling factors containing a phase adjustment such that when an input signal is multiplied by concatenated sets of scaling factors a resulting output signal will be centered at the center frequency of the second frequency band; receiving in the processor a successive series of samples of the input signal; successively multiplying in the processor each of the samples by the plurality of sets of scaling factors by rotating between the plurality of sets of scaling factors; and in the processor, summing the outputs of the multiplications.

In another embodiment is a circuit for down-converting an input signal from a first frequency band to a second frequency band, comprising: a parallel array of sampling circuits for sampling the input signal in response to a timing signal, the array configured such that the successive sampling circuits create a samples of the input signal in time-delayed succession at pre-determined intervals, and each individual sampling circuit operates at a rate of the interval between samples times the number of sampling circuits; a processor for multiplying the samples by a plurality of sets of scaling factors by rotating between the plurality of sets of scaling factors at the rate at which each individual sampling circuit operates, each set of scaling factors corresponding to the coefficients in a Fourier series approximation of the desired transfer function and containing a phase adjustment such that if the scaling factors are multiplied by a window function and an input signal multiplied by the concatenated sets of windowed scaling factors, a resulting output signal will be centered at the center frequency of the second frequency band; and a summer for summing the outputs of the multiplications.

In still another embodiment is a non-transitory computer readable storage medium having embodied thereon instructions for causing a computing device to execute a method of designing a filter for down-converting an input signal from a first frequency band to a second frequency band, the method comprising: receiving in a processor a selected transfer function for the circuit, including a center frequency of the second frequency band; calculating in the processor a first set of scaling factors corresponding to the coefficients in a Fourier series approximation of the desired transfer function; multiplying in the processor the first set of scaling factors by a window function; calculating in the processor a plurality of additional sets of scaling factors based on the first set of scaling factors, each additional set of scaling factors containing a phase adjustment such that when an input signal is multiplied by concatenated sets of scaling factors a resulting output signal will be centered at the center frequency of the second frequency band; receiving in the processor a successive series of samples of the input signal; successively multiplying in the processor each of the samples by the plurality of sets of scaling factors by rotating between the plurality of sets of scaling factors; and in the processor, summing the outputs of the multiplications.

In yet another embodiment is a computer implemented method of down-converting an input signal from a first frequency band to a second frequency band, comprising: receiving in a processor a selected transfer function for the circuit, including a center frequency of the second frequency band; calculating in the processor a first set of scaling factors corresponding to the coefficients in a Fourier series approximation of the desired transfer function; multiplying in the processor the first set of scaling factors by a window function; calculating in the processor a plurality of additional sets of scaling factors based on the first set of scaling factors, each additional set of scaling factors including a phase adjustment to the first set of scaling factors such that when an input signal is multiplied by concatenated sets of scaling factors a resulting output signal will be centered at the center frequency of the second frequency band; receiving in the processor a successive series of samples of the input signal; successively multiplying in the processor each of the samples by the plurality of sets of scaling factors by rotating between the plurality of sets of scaling factors; and in the processor, summing the outputs of the multiplications.

DETAILED DESCRIPTION OF THE INVENTION

The present application describes a system and method for down-converting RF signals to IF signals by sampling the signals in a round-robin sampling circuit and multiplying the samples by coefficients that are changed at a fixed rate equal to the rate of operation of each of the sampling circuits. Such a system and method avoids the difficulty and cost of directly digitizing the RF signal, while providing simultaneous operation on multiple channels. Specifically, the system described here is able to simultaneously take sections of the input RF spectrum and down-convert them to adjacent positions in the IF frequencies while rejecting unwanted image signals. No phase-locked loop is required as in many conventional receivers. The mathematical basis of such a system, and thus a method of designing the system, is also described.

For example, in the description above the TV, GPS and digital data signals being received could be processed with four simultaneous down-conversions. The RF spectrum from 500 MHz to 506 MHz containing TV channel 19 could be down-converted to an IF frequency spectrum of, for example, 5 MHz to 11 MHz. The GPS L1 signal at 1.57542 GHz could be down-converted to, for example, 20 MHz, the GPS L2 signal at 1.2276 GHz could be down-converted to, for example, 35 MHz, and a 2.4 Ghz channel could be down-converted to, for example, 90 MHz. An ADC operating at 250 mega-samples per second (MS/s) could then digitize the entire IF band up to 125 MHz, thus capturing the TV, GPS and digital data signals. Each signal could then be processed and separated in the DSP.

As above, a conventional approach to digitizing any of these signals would be to use a conventional FIR filter or an ADC to sample the signal, thus requiring, for the GPS L1 signal at 1.57542 GHz, an ADC operating at almost 3.2 GHz. By contrast, in the present embodiment, each RF signal is directly sampled at a rate substantially higher than the RF frequency by a circuit operating at a substantially lower frequency, and then "mixed" with, i.e., multiplied by, a second frequency to generate an IM frequency. The circuit is known in the art as a "direct sampling mixer" or DSM to reflect this function.

U.S. Pat. No. 7,028,070 ("the '070 patent"), entitled "High Speed Filter" (as well as the continuation of the '070 patent, U.S. Pat. No. 8,001,172) describes an alternative way of obtaining a discrete approximation to a Fourier integral of a signal using a substantially analog signal processing array which operates at a lower frequency than the input signal, by using a series of sampling elements activated in a "round-robin" fashion to implement a down-conversion. The '070 patent is incorporated herein by reference as though set forth in full.

Figure 2:
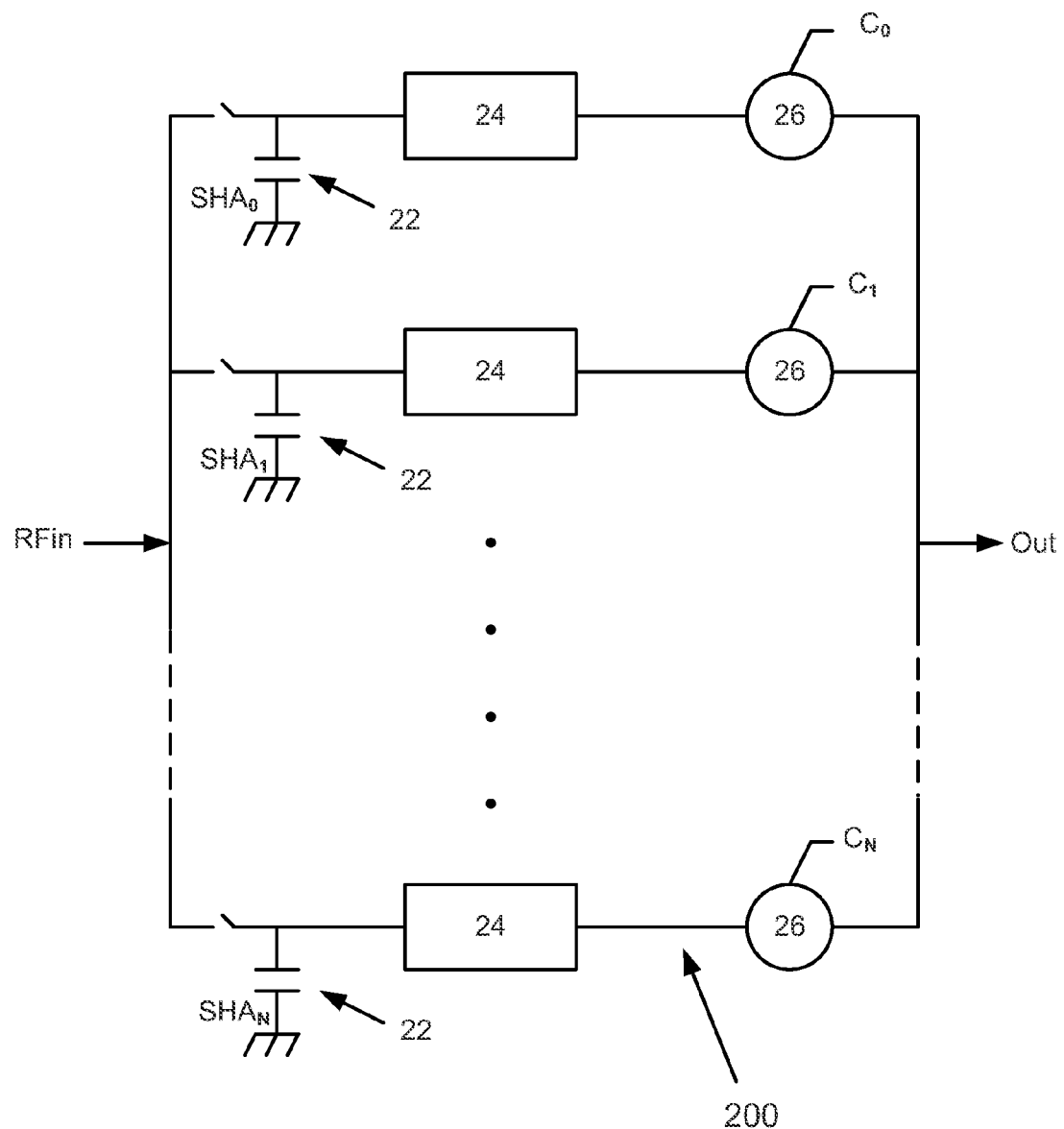
FIG. 2 is a block diagram of a circuit for directly sampling an RF signal at a rate substantially higher than the RF frequency and multiplying the RF signal by a second frequency according to one embodiment.

The DSM of the present application builds upon and enhances the principles of the circuit described in the '070 patent. FIG. 2 illustrates one embodiment in which a DSM 200 contains a plurality N of sample and hold amplifiers (SHAs) 22, an equal number N of identical filter elements 24, and an equal number N of multipliers 26. The number N is considered to be the "length" of the filter.

An RF input signal $RF_{IN}$ is applied to the SHAs 22 in parallel, rather than being passed from one SHA to the next, but each SHA 22 is activated in sequence so as to operate in a round-robin order. Specifically, a first SHA 22 (labeled $SHA_0$) is first activated to sample the signal $RF_{IN}$, then a second SHA 22 ($SHA_1$) is activated to sample $RF_{IN}$, then $SHA_2$ is activated, etc. up to $SHA_N$. After all of the SHAs have been activated in sequence, $SHA_1$ is activated again, then $SHA_2$ is activated again, etc.

As above, in a conventional FIR filter, the time interval between the activation of one SHA and the next should be 400 pS in order to achieve an effective sampling rate of 2.5 GS/s, which as above is desirable to sample a 1.25 GHz signal. However, in the circuit of FIG. 2, while the SHAs 22 are activated at intervals of 400 pS, it is only necessary to sample the RF signal every 400 pS times the length of the filter. If there are 200 SHAs 22 in the circuit 20, each SHA 22 may operate at intervals of 400 pS*200, or 80 nanoseconds (nS), and thus each SHA need only operate at a frequency of 12.5 MHz (i.e., 1480 nS)), rather than at the 2.5 GHz or higher rate that would be required for a single ADC to adequately sample such a 1.25 GHz signal. This 12.5 MHz frequency is sometimes also known in the art as the "rate of rotation."

One of skill in the art will appreciate that such a round-robin operation will appear mathematically as if a conventional FIR filter is operated with rotating coefficients. An ordinary FIR filter results in an output Y where:

$$Y = \sum_{i=0}^{N-1} X_i * W_i$$

where $X_i$ are the successive inputs from the SHAs and $W_i$ are the coefficient values. The round-robin operation results in an output Y at a time j of:

$$Y_j = \sum_{i=0}^{N-1} X_i * W_{i+j}$$

where the index operation is modulo N. The coefficients W appear to rotate through the entire set of $W_i$ in lockstep with the operation of the SHAs.

This is a mathematical convenience as nothing in the circuit is required to "cause" such a rotation; rather, the rotation appears because the input signal is not actually being passed down the SHAs as in a conventional FIR filter, but one SHA is selected at a time in the round-robin operation. It is this equivalence that allows the round-robin operation to create a signal that appears to have come from a conventional FIR filter operating at a much faster rate.

Thus, the problem of generating a clock and a circuit operating at 2.5 GHz has been replaced with the problem of providing 200 clocks at 12.5 MHz, the clocks offset at 400 pS intervals. One technique for easily creating such offset clocks is described in U.S. patent application Ser. No. 13/414,487, commonly owned by the assignee of the present application. Other techniques are known in the art, for example, delay locked loops.

The output each of these samples taken by the round-robin action of the SHAs 22 is fed to one of the filters 24. Each filter 24 has a relatively low bandwidth compared to the RF signal frequency. For example, each filter 24 may be a 20 MHz low pass filter; even though the filters 24 are placed before the multipliers as shown in FIG. 2, each filter will process only the base-band signal that was used to modulate the RF signal, and not the RF signal itself. The use of a 20 MHz low pass filter for each filter 24 thus effectively creates a base-band filter of ±20 MHz, or a base-band filter that is 40 MHz wide.

The output of each filter 24 is passed to a corresponding multiplier 26 as shown. In addition to the filtered output, each of the N multipliers receives a second input value $C_0$ to $C_N$ representing a coefficient of the Fourier series approximation of a desired signal to be mixed with the RF signal. In operation, the DSM thus acts as a virtual local oscillator, and generates a virtual signal which is the equivalent of the second signal that is mixed with the RF signal in the conventional approach.

It may thus be seen that circuit 200 may down-convert an RF signal if an appropriate number of multipliers and corresponding coefficients are chosen. For example, in the case of the television signal at 500 MHz, and using a circuit as shown in FIG. 2 in which N=256, the 256 coefficients may be such that the Fourier series describes a sinusoid that completes 19 cycles. In this case, the value of any coefficient $C_n$ for n=0 to 255 is calculated as:

$$C_n = \sin\left(2\pi * \frac{19}{256} * n\right)$$

As explained in the '070 patent, if the sample interval between each SHA 22 is 150 pS, each SHA may operate at a rate of 26.17 MHz (i.e., 1/(256*150 pS)), and the effective local oscillator thus produces a virtual signal $F_{LO}$ of:

$$F_{LO} = \frac{19}{150\ pS * 256} = 494.8\ \text{MHz}$$

Figure 1:
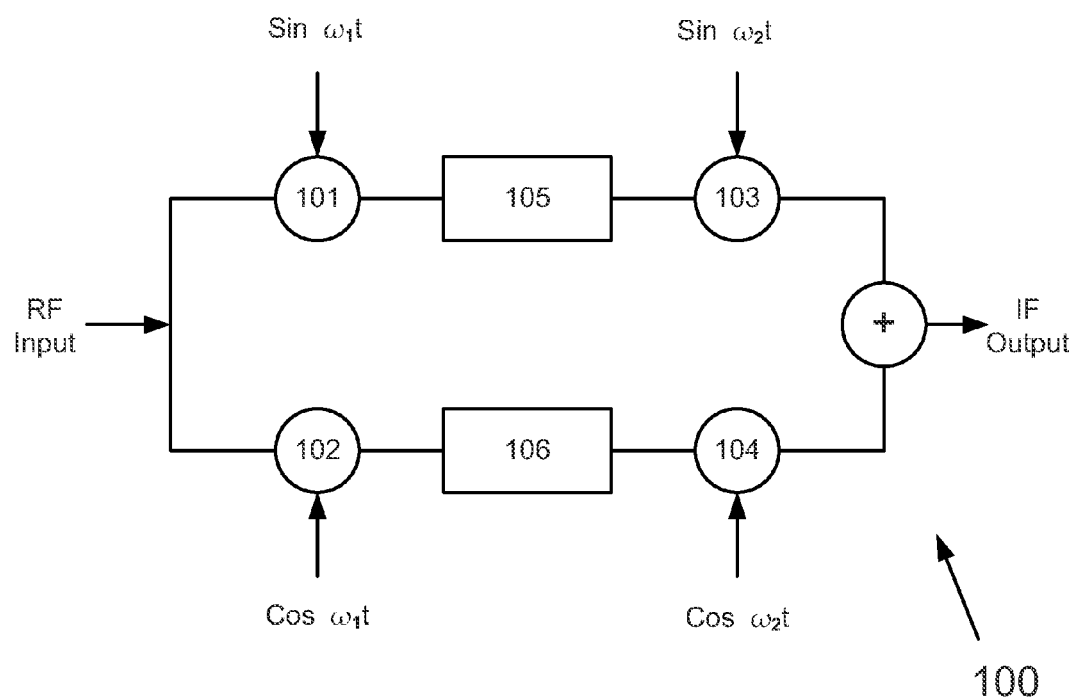
FIG. 1 is a block diagram of a prior art quadrature modulator circuit or eliminating an undesired image signal, for example in a heterodyne receiver.

With this virtual signal, if the RF input signal $F_{REC}$ is at 500 MHZ, a signal of 5.2 MHz (500 MHz 494.8 MHz) will be present at the output node labeled Out in FIG. 1. Similarly, if the input signal is 506 MHz, a signal of 11.2 MHz will be present at the output (506 MHz–494.8 MHz); the same will be true for all frequencies in between 500 MHz and 506 MHz. Thus, the range of signals from 500 MHz to 506 MHz will be down-converted to a range of 5.2 MHz to 11.2 MHz.

As explained above, in a conventional heterodyne receiver such down-conversion has an "image problem." in the above case, in addition to the down-conversion of the 500 MHz signal to one at 5.2 MHz, there will also be down-conversion to 5.2 MHz of an "image" signal having an original frequency of 489.6 MHz, since 494.8 MHz less 489.6 MHz also equals 5.2 MHz, as does the desired signal's frequency of 500 MHz less 494.8 MHz. Both 500 MHz and 489.6 MHz thus down-convert to 5.2 MHz, and, once converted, the second, unwanted "image" signal cannot be separated.

Circuit 200 of FIG. 2 may suffer from the same problem. Thus, the image signal should be rejected for the radio to be able to properly receive the desired signal. Again, in a conventional architecture the Weaver architecture is commonly used to accomplish the rejection of the image signal. Thus, one possibility is to create a "virtual" Weaver architecture using the DSM of FIG. 2.

Figure 3:
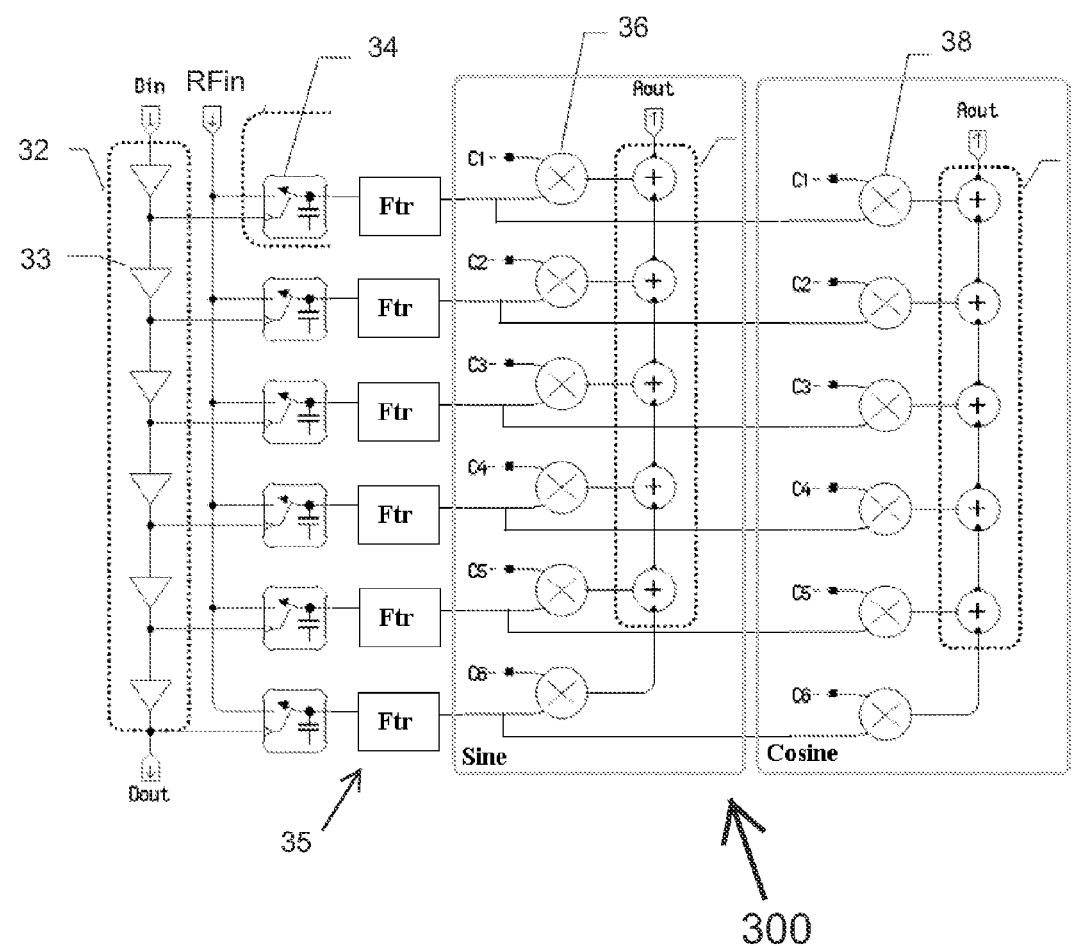
FIG. 3 is a block diagram of a circuit for directly sampling an RF signal at a rate higher than the RF frequency and multiplying the RF signal by sine and cosine waves of a second frequency according to one embodiment.

A circuit 300 incorporating both the DSM 200 of FIG. 2 and a portion of the quadrature modulator 100 of FIG. 1 is shown in FIG. 3. Circuit 300 contains a "delay line" 32 having a plurality of "delay elements" 33; however, in this case the delay elements 33 do not transmit the input signal as in a conventional FIR filter, but rather activate a plurality of SHAs 34 sequentially at appropriate times. Each SHA 34 receives the input signal $RF_{IN}$ simultaneously and, when activated by a corresponding delay element 33, passes it to a filter 35, for example, a low-pass filter as described above. (In an alternative to using delay elements 33 to cause sequential operation of the SHAs, a clock or shift register may also be used.)

The signals from the filters 35 are in turn passed to a first plurality of multipliers 36 and a second plurality of multipliers 38. The first plurality of multipliers 36 receives coefficients representing the sine of a frequency to be mixed with, and used to down-convert, the RF signal, while the second plurality of multipliers 38 receives coefficients representing the cosine of the same frequency. The sum of the first plurality of multipliers 36 is the sine of the mixing frequency, and the sum of the second plurality of multipliers is the cosine of the mixing frequency. Thus, the two pluralities of multipliers 36 and 38 act as the multipliers 101 and 102 of circuit 200 in FIG. 1.

The use of the filter elements 35 in the circuit 300 of FIG. 3 accomplishes the same filtering function as that of the low pass filters 105 and 106 in circuit 200 of FIG. 2, even though the filters are located before the pluralities of multipliers 36 and 38. Thus, to complete the Weaver architecture, a second pair of mixers is needed, again operating in quadrature. This might be accomplished, for example, by adding additional pluralities of multipliers having coefficients for the sine and cosine of an additional frequency.

However, in one embodiment this is not accomplished by using additional sets of multipliers to construct the sine and cosine waves of a second frequency, but rather by using a multiplier operating at 4 times the desired second frequency. This allows the second "sine" multiplier of the Weaver architecture (multiplier 103 in FIG. 1) to accept, for example, a series of coefficient values:

0 1 0 −1 0 1 0 −1 etc., which is simply a series of the values of a sine wave sampled at 4 times its frequency.

The second "cosine" multiplier may similarly accept a series of values:

1 0 −1 0 1 0 −1 0 etc., which is similarly the series of values of a cosine wave of the same frequency also sampled at 4 times the frequency. It may be noted that this requires that only three coefficient values be implemented here, i.e., 0, 1 and −1, and that when the coefficient provided to one of these two multipliers is non-zero the coefficient of the other multiplier will always be zero.

Figure 4:
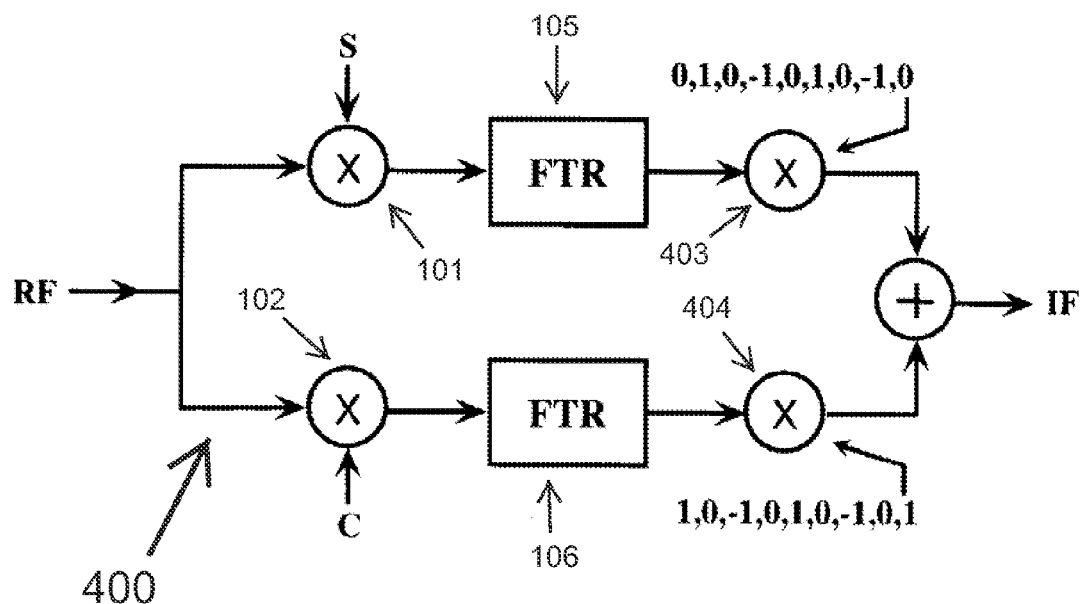
FIG. 4 is a block diagram of a modified version of the quadrature modulator circuit of FIG. 1 using a quantized version of the second set of multipliers according to one embodiment.

Accordingly, FIG. 4 shows a variation of the Weaver architecture circuit 100 of FIG. 1 in which the second pair of multipliers 403 and 404 operate at four times the frequency of multipliers 403 and 404 in FIG. 1, and receive only the inputs 0, 1, and −1 as described above. (The SHAs are again not shown here.) As described above, in circuit 400 multipliers 403 and 404 now do not receive coefficients representing actual sine and cosine values as in FIG. 1, but rather receive, at four times the mixing frequency, the two series of values above representing the sine and cosine of the mixing frequency.

It can be seen in circuit 400 of FIG. 4 that to implement the second set of multipliers in such a DSM, it is only necessary that multipliers 403 and 404 pass either no signal (0), the positive version of the signal (1), or the negative version of the signal (−1). For this reason, including the Weaver architecture in the circuit 200 of FIG. 2 only requires adding a choice of outputs from multipliers 101 and 102, as filtered by filters 105 and 106.

Figure 5:
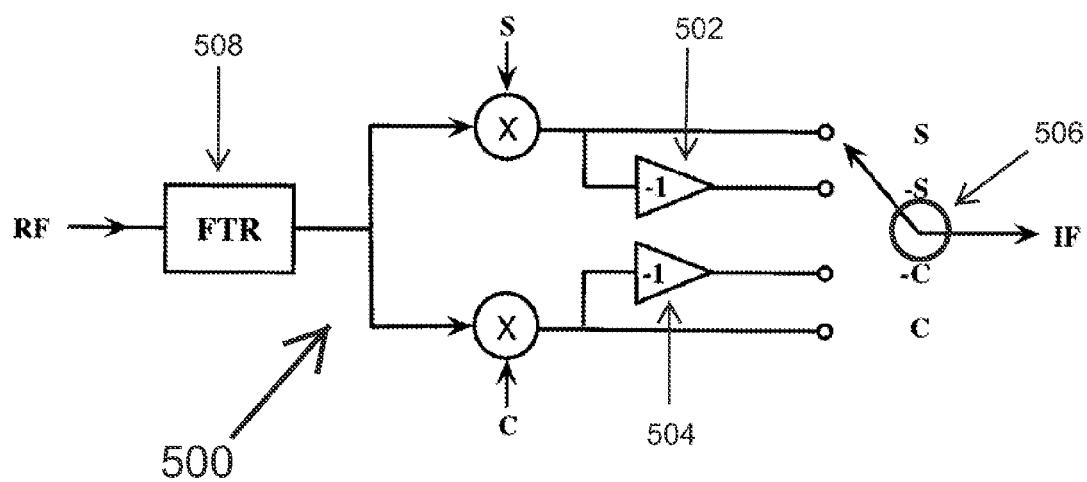
FIG. 5 is a clock diagram of a modified version of the circuit of FIG. 4 using a single quantized process for the second set of multipliers according to one embodiment.

Another possible simplification of the circuit is thus shown in circuit 500 in FIG. 5, in which, rather than using multipliers, output selection may be accomplished with two inverters 502 and 504, and a four-way selector switch 506 operating at the frequency of multipliers 403 and 404 in FIG. 4 that allows selection of the upper path (sine) value, either directly or inverted, or the lower path (cosine) value, either directly or inverted. Filters 105 and 106 in FIG. 4 have been replaced by a single filter 508 in FIG. 5, which accomplishes essentially the same function, i.e., filtering the base band signal as contained in the RF signal without filtering the RF signal itself.

So far, it is assumed that the coefficients applied to the multipliers are fixed in advance at the desired values. If the coefficients can be dynamically changed quickly enough, the circuit of FIG. 5 can be simplified still further as shown in FIG. 6; there is no need for even two separate input multipliers 101 and 102, but rather only a single multiplier is needed as long as the desired coefficients can be applied at the appropriate time.

Figure 6:
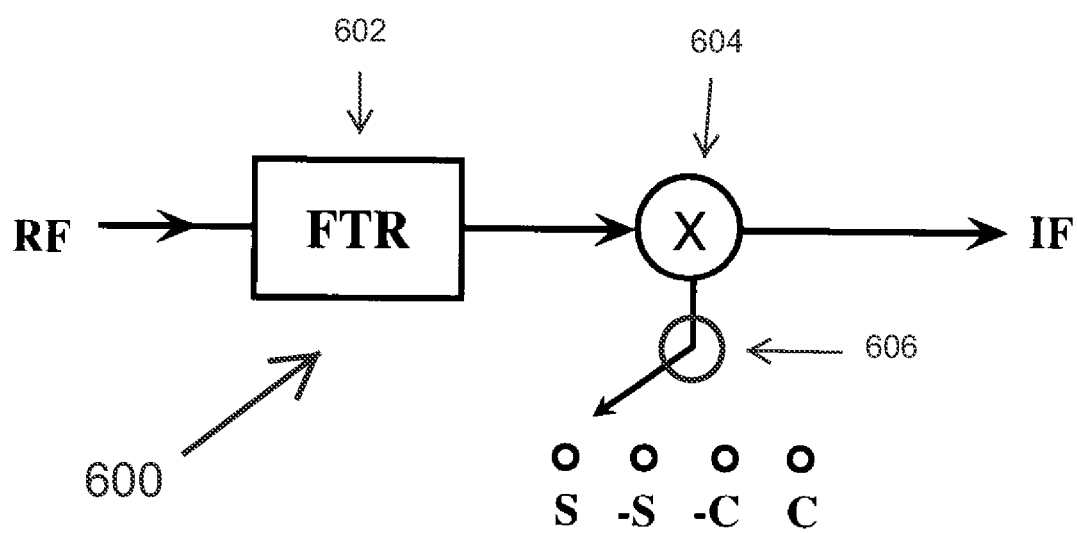
FIG. 6 is a block diagram of a modified version of the circuit of FIG. 5 allowing for adjustable coefficients for the multipliers according to one embodiment.

Thus, in FIG. 6, a circuit 600 receives the sampled RF signal and first filters it with filter 602 as described above. Following this, there is a single multiplier 604 and a switch 606 that selects from four different coefficient sets. The four coefficient sets correspond to the sine and cosine waves of the first mixing frequency and their inverses, as indicated by "S," "C," "−S," and "−C" respectively. The coefficient sets are selected and loaded into the multiplier at four times the second mixing frequency in the order in which non-zero values appear as seen in the sequences described with respect to FIG. 4, i.e., the first selection will be "C," then "S," "−C," and "−S."

When produced in this way, the output IF signal is indistinguishable from that which would be produced by a radio using the Weaver architecture in which the sine and cosine channels are well matched. No image signal is present in the output signal, but the signals between the input multipliers 101 and 102 and the output multipliers 103 and 104 of the Weaver architecture as shown in FIG. 1 do not exist in this implementation. In effect, the second multipliers of the Weaver architecture are constructed "virtually" by multiplexing the required coefficient terms at four times the mixing frequency.

A more detailed explanation of this digital implementation of the Weaver architecture may be found in the PCT application published as International Publication No. WO 2011/069229, commonly owned by the assignee of the present application.

Figure 7:
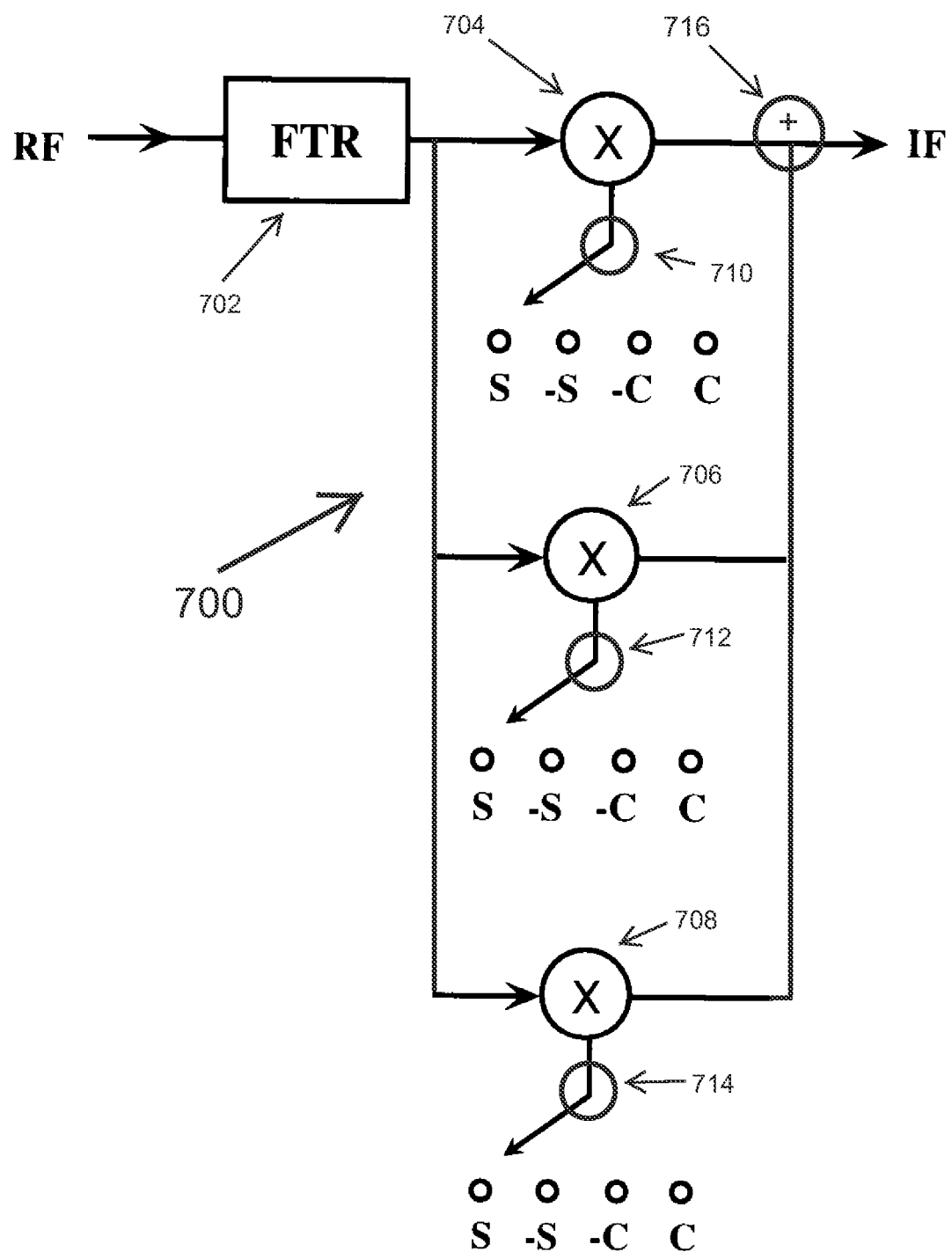
FIG. 7 is a block diagram of a circuit comprised of repeated instances of the circuit of FIG. 6 for down-converting multiple RF signals simultaneously according to one embodiment.

With this structure, all that is necessary to receive multiple frequencies at the same time is to repeat the multiplier 604 and selection switch 606 of FIG. 6 the desired number of times, as shown in circuit 700 of FIG. 7. The sampled RF signal is filtered by filter 702 as described above; a single filter 702 will generally suffice, since in most cases the same filter will be desired for each signal to be down-converted.

The filtered signal is then fed to each of the multipliers 704, 706 and 708. (While three multipliers are illustrated here, it will be appreciated that there may be any desired number of multipliers.) Each multiplier receives a set of sine, cosine and inverse sine/cosine coefficients from one of the selection switches 710, 712 or 714. The coefficients provided to each multiplier may differ, as may the rates at which the selection switches change from one set of coefficients to the next. In this way, each multiplier may down-convert a different frequency or channel of the RF signal to a desired frequency or range. The sum of the down-converted frequencies from an adder 716 is the output IF signal which may then be further processed as if from a conventional super-heterodyne receiver.

For example, the multiplier 704 may have 256 individual multipliers offset by 150 pS each with coefficients describing a sinusoid wave of 17 cycles, so that the virtual local oscillator frequency is 447.2 MHz. A 500 MHz input signal will thus be converted to 57.3 MHz by the multiplier. If the switch 710 rotates coefficients at 208.4 MHz (52.1 MHz times 4), the output from the first multiplier will be 5.2 MHz (57.3 MHz minus 52.1 MHz).

The multiplier 706 may have the same number of individual multipliers and offset, but coefficients describing a wave of 58 cycles, so that the virtual local oscillator frequency is 1.51 GHz. The GPS L1 signal at 1.57542 GHz will thus be converted to approximately 65 MHz. If the switch 712 rotates at 180 MHz (45 MHz times 4), the output from multiplier 706 will be at 20 MHz.

Thus, in this case multipliers 704 and 706 may downconvert a 500 MHz signal to 5.2 MHz, and a 1.57 GHz signal to 20 MHz so that two RF signals normally widely separated in frequency appear nearly side by side in the IF output. The resulting composite signal containing both desired signals is suitable to be converted by an ADC operating at a relatively modest frequency, possibly as low as 40 MHz (although one of skill in the art will appreciate the benefit of using a higher frequency ADC, such as 100 MHz), rather than the approximately 3.2 GHz frequency that would be required to sample the unconverted signals, including the original 1.57 GHz GPS L1 signal.

Since the Weaver architecture uses sine and cosine waves, there are additional constraints on the circuit 500 of FIG. 5, or circuit 600 of FIG. 6. First, in order to generate the second mixer frequency in the Weaver architecture, i.e., the speed at which switch 506 or 606 selects coefficients, a clock synthesizer is required. Further, since the virtual local oscillator is represented by the coefficient sequences, the sequences should be phase-continuous at the ends, i.e., an integer number of sine or cosine waves should fit into the coefficient. It will be seen that in all of the examples above, the number of cycles is a whole number.

In the example above of 200 SHAs with a rate of rotation at 12.5 MHz and offset 400 pS, resulting in an effective sampling rate of 2.5 GHz, this means that only frequencies that are a whole number times 12.5 MHz are available in the local oscillator. For example, if the coefficients describe a wave of 23 cycles, the local oscillator frequency will be 23 times 12.5 MHz, or 287.5 MHz. The next available higher frequency would be 24 times 12.5 MHz, or 300 MHz.

Figure 8:
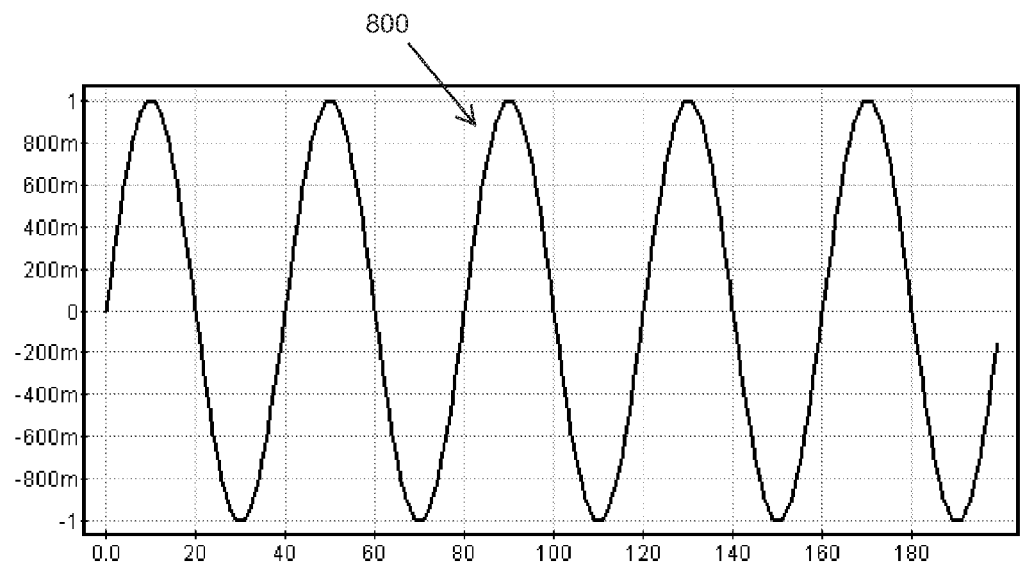
FIG. 8 is a graph of a sine wave that is phase continuous when repeated.
Figure 9:
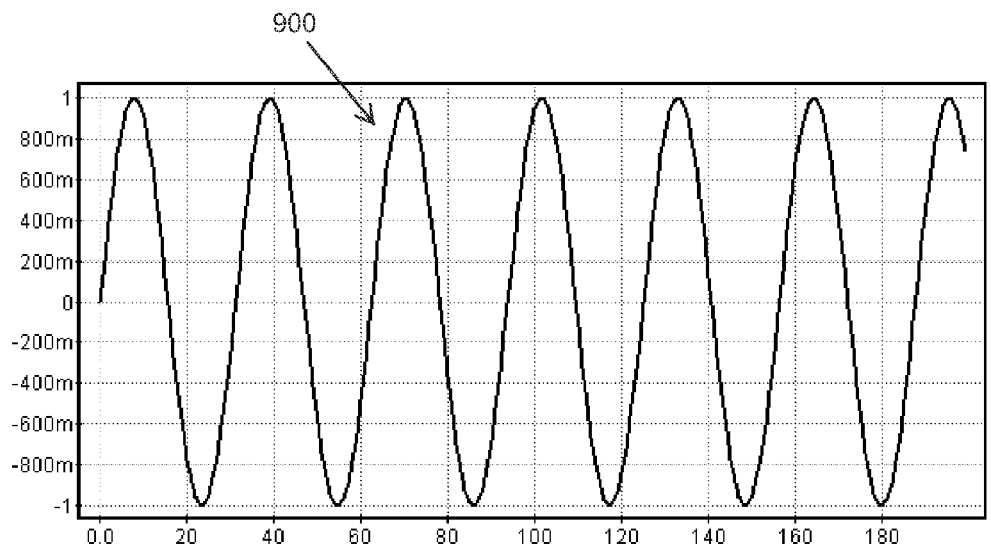
FIG. 9 is a graph of a sine wave that is not phase continuous when repeated.

However, in practice it will at times be preferable to use coefficients that do not describe a pure sinusoidal wave, and which do not repeat a whole number of times. This is illustrated in FIGS. 8 and 9. FIG. 8 shows a sinusoidal wave 800 of 5 cycles that fit within the time 0 to 200, and thus would be phase continuous if the time period is repeated end to end in the virtual local oscillator, while FIG. 9 shows a sinusoidal wave 900 having a non-integer number of cycles within the same time period, and thus would not be phase continuous if the time period is repeated. (The x-axis in each figure is the index to each coefficient.)

A more complex set of coefficient values that return to zero at the boundary so as to be phase continuous may be generated by multiplying by a window function. As is well known in the art, a window function is a function with a value of zero outside some chosen interval. A common type of window function used in filters is a rectangular window, which lets a signal pass through when it is within the frequency bounds of the window, and results in a value of zero outside the window. The use of an appropriate window function not only limits the series of coefficients to a finite number, but can also suppress the occurrence of Gibbs phenomena, the oscillations that occur due to the behavior of a Fourier series at a discontinuity as a result of the truncation of the series.

One particular window function that is well known is a Kaiser window. The Kaiser window is generally considered to be a "near perfect" window function, and, when applied to a sine wave, is believed to result in as close to an impulse response as is possible. In one embodiment, the Kaiser window may be parameterized by α=2.7. If the Kaiser window function is represented by $K_{\alpha=2.7}(i)$, then a reasonably sufficient approximation of the Fourier transform coefficients for the Dirac function, indexed by i, is given by:

$$C(i) = K_{\alpha=2.7}(i) * \sin(\omega * \delta * i)$$

where ω is the non-zero radian frequency in the frequency domain plot, and b is the unit delay in the delay line. One of skill in the art will appreciate that a trade-off between the resolution in frequency and the amplitude of the stop band may be made by changing the parameter of the Kaiser window appropriately.

Figure 10:
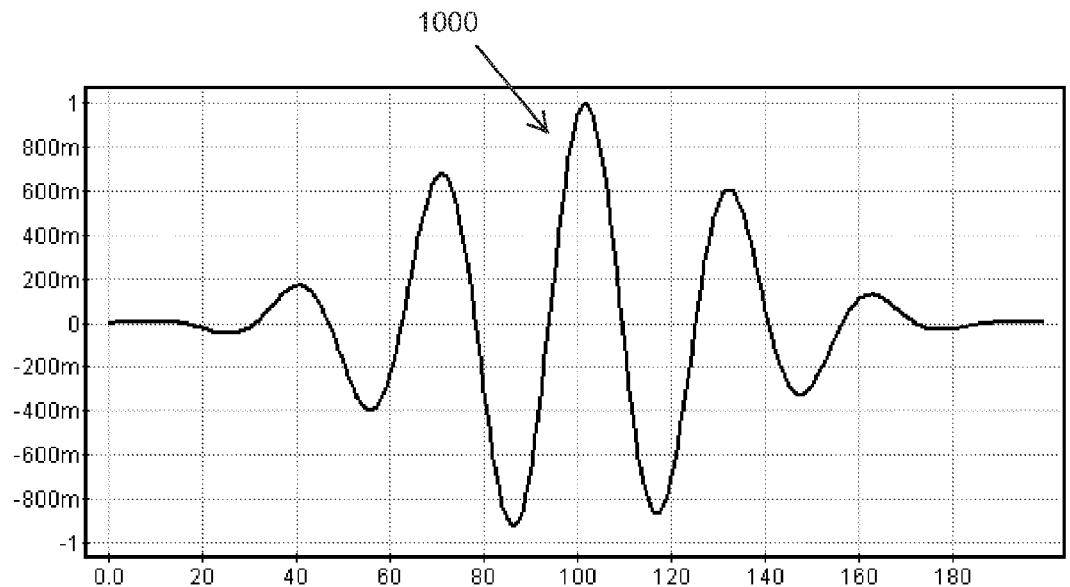
FIG. 10 is a graph of the wave that results from multiplying the wave of FIG. 9 by a Kaiser window.
Figure 11:
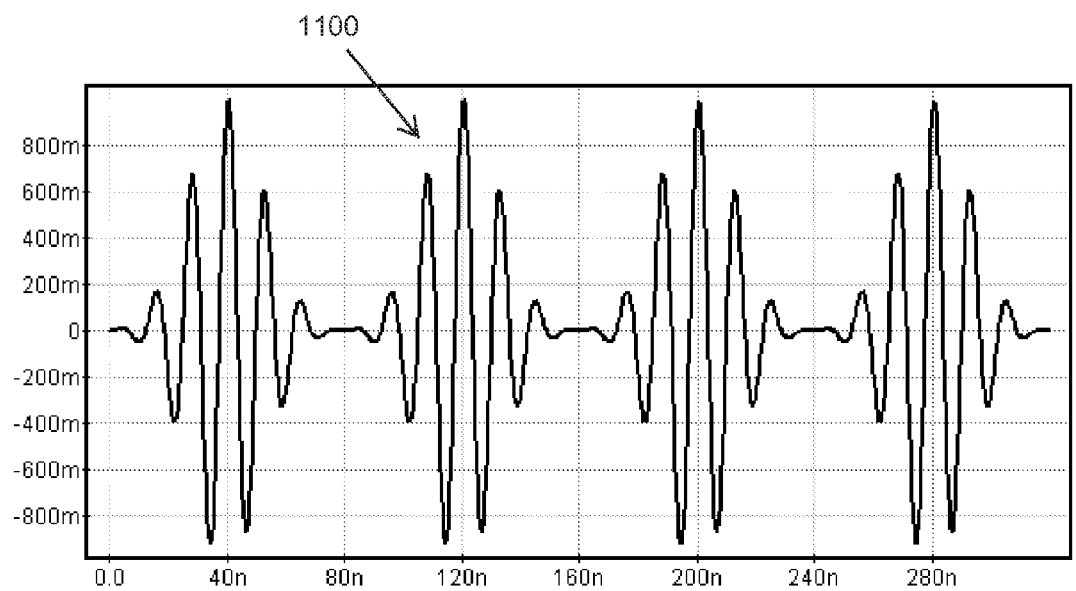
FIG. 11 is a graph of the wave of FIG. 10 repeated four times.

Multiplying the curve 900 of FIG. 9 by the Kaiser window results in the curve 1000 of FIG. 10. When curve 1000 is laid end to end, the equivalent local oscillator at four times the frequency of FIG. 9 is shown by curve 1100 in FIG. 11. (Here the x-axis is the time of application of each coefficient value, so that the scale differs from FIGS. 8-10 by the sampling rate.)

Prior to the use of the window function, for a FIR filter with a response of (sin x)/x the coefficient values were given by:

$$C_i = \sin\left(2\pi * i * \frac{Q}{N}\right)$$

where N is the number of SHAs and s any integer from 1 to N/2. The corresponding virtual local oscillator frequency $F_{vlo}$ will be Q times the rate of rotation, i.e., 12.5 MHz in the example above.

After multiplying by the Kaiser window function, the coefficient values are given by:

$$C_i = K_{\alpha=2.7}(i) * \sin\left(2\pi * i * \frac{F_{vlo}}{12.5 \text{ MHz} * N}\right)$$

Figure 12:
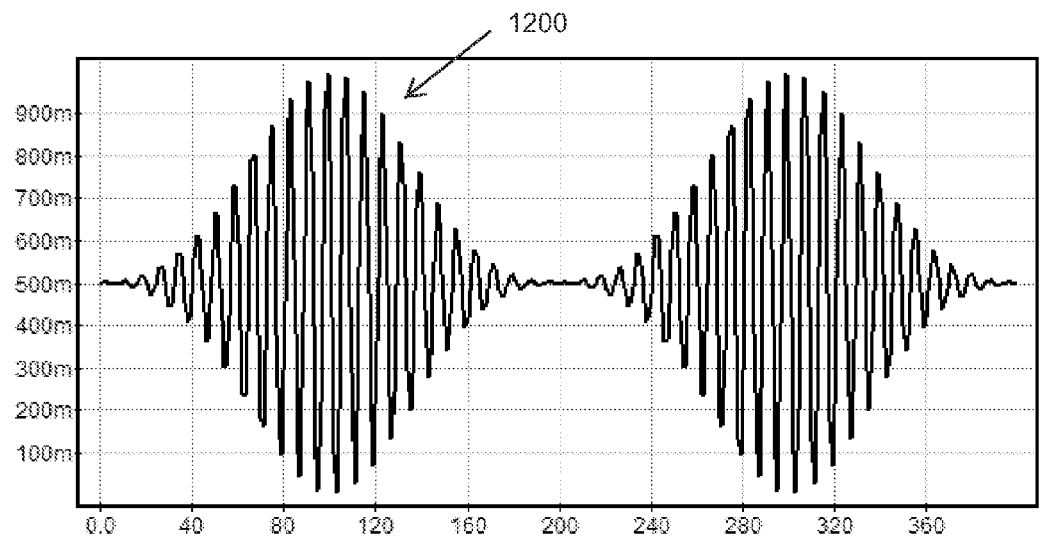
FIG. 12 is a curve showing a concatenation of two instances of the curve produced by a set of 200 multiplier coefficients in one embodiment.

The actual virtual local oscillator signal is then a concatenation of the $C_i$ values, which may be written as $C_iC_iC_iC_iC_i$, recalling that each $C_i$ is itself a sequence of N (here 200) values. Curve 1200 in FIG. 12 is composed of two such concatenated $C_i$ curves $C_iC_i$.

Figure 13:
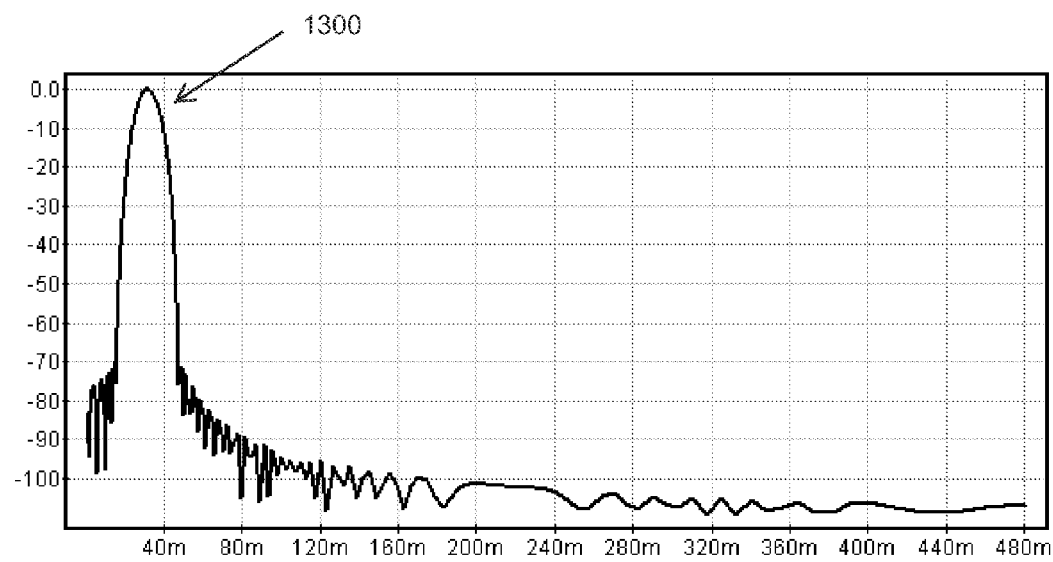
FIG. 13 is the frequency response of a circuit for sampling an RF signal using the coefficients represented by the curve of FIG. 12 in one embodiment.

This will also improve the frequency response; a sample response curve 1300 is shown in FIG. 13. (As is known in the art, the x-axis is a fraction of the sample rate, expressed in thousandths; since a digital filter cannot properly handle a signal greater than half of the sampling rate, the x-axis goes from 0 to 480/1000 or 0.48 of the sampling rate. Thus, the peak shown, at 30/1000 or 0.03, indicates the greatest response of the filter is at 0.03 times the sampling rate.) The filter is sharp, and since the window function has forced the coefficients to go to zero at the boundaries, they can be concatenated together to make the virtual local oscillator. While the virtual local oscillator is no longer sinusoidal, if the output is sampled at the rate of rotation, this acts like a signal frequency, and the result is identical to having a sinusoidal input.

It should be noted that while this example uses the Kaiser window, there are many possible window functions; for example, another well known window function is the Blackman window. One of skill in the art will appreciate the differences between window functions, and be able to select a suitable window function for a desired application.

However, where a window function has forced a non-sinusoidal function to be continuous as in FIGS. 9 and 10 above, another problem can arise. Where down-conversion is done by a conventional FIR filter with a (sin x)/x response, the IF signal will be centered at the middle of the filter response. Thus, a 700 MHz signal down-converted to 10 MHz will be centered at 10 MHz.

On the other hand, a non-sinusoidal function will result in a response that is not centered. Thus, while the window function allows non-phase coherent coefficient sets (such as FIG. 9) to be appended and be zero at the boundaries as shown in FIG. 12, the difference in phase between each burst (such as the four bursts in FIG. 11) results in an output that is intended to be down-converted to MHz but is not centered at that desired filter response. Thus, in FIG. 13 it may be seen that while the response is sharp, the peak response is not centered at 10 MHz, and in fact the response at 10 MHz is rather small.

This may be corrected and the peak response located at the intended frequency by adding a phase correction P to the coefficients of each burst. Thus, for each burst j, the coefficients may now be specified by:

$$C_{ij} = K_{\alpha=2.7}(i) * \sin\left(2\pi * i * \frac{F_{vlo}}{12.5 \text{ MHz} * N} + P_j\right)$$

and the virtual local oscillator signal is now specified by the concatenated coefficient values $C_{i0}C_{i1}C_{i2}C_{i3}C_{i4}$ etc.

In one case, $P_j$ is set equal to $\delta_P*j$, where $\delta_P$ is an additional phase change that corresponds to a frequency shift in the local oscillator quantized to the rotation rate. Since j increments with each burst, the phase change will progressively change for each burst as well. The phase change is imposed and holds for the duration of the burst, and then shifts again for the next burst. Thus, if viewed at the rate of rotation, there will appear to be a continuous additional effective frequency that is imposed on the signal (and observed only when sampled at the rotation rate). By choosing this additional frequency properly, the down-converted signal may be realigned with the center the filter frequency, although at a cost of the control electronics that update the coefficients at the rotation rate.

A circuit constructed in this fashion is mathematically linear, so that coefficients representing different sine waves may be combined to obtain any desired filter response. Thus, a more generalized formula for coefficients becomes:

$$C_{ij} = \sum_k K_{\alpha=2.7}(i) * A^k * \sin\left(2\pi * i * \frac{F_{vlo}^k}{12.5 \text{ MHz} * N} + \delta_P^k * j\right)$$

$$= K_{\alpha=2.7}(i) * \sum_k A^k * \sin\left(2\pi * i * \frac{F_{vlo}^k}{12.5 \text{ MHz} * N} + \delta_P^k * j\right)$$

since the window function is the same in each case. Each set of coefficients may have a different amplitude $A^k$, a different virtual local oscillator frequency $F_{vlo}$, and/or a different phase change $\delta_P$.

Figure 14:
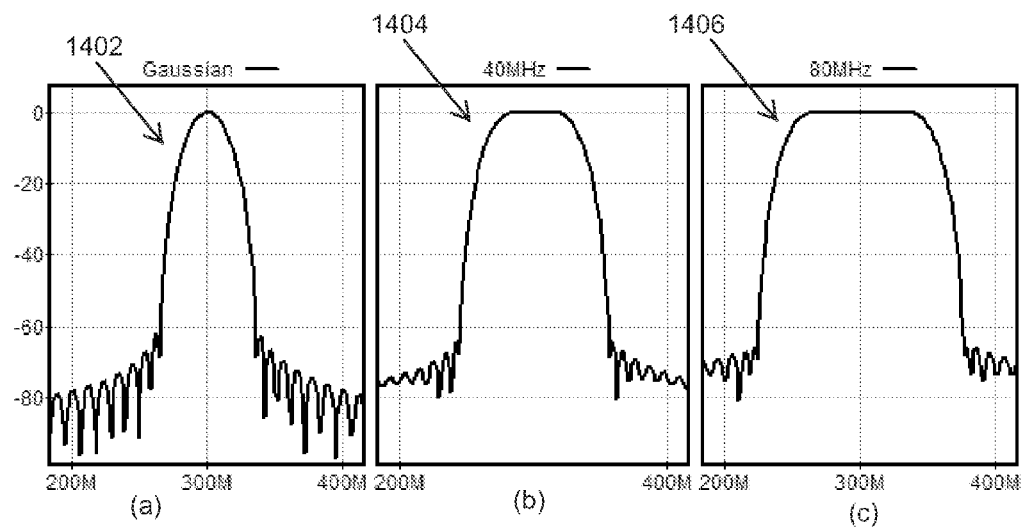
FIG. 14 is a set of curves illustrating how a flat-top response curve may be constructed from a plurality of Gaussian responses.

FIG. 14 shows an example of this, in which curve 1402 shows an approximately Gaussian response (approximate because of the finite length of the filter), where k=1 and $F_{vlo}^k=\{300 \text{ MHz}\}$. Curves 1404 and 1406 show flat-top responses where k is greater than 1 that allow the IF signal to be flat over a band; for example, in the United States, TV signals must be flat over a 6 MHz bandwidth (8 MHz in Europe) and Wi-Fi requires a 50 MHz flat-top bandwidth response. Curve (b) shows a 40 MHz band obtained by using $F_{vlo}^k=\{280 \text{ MHz}, 300 \text{ MHz}, 320 \text{ MHz}\}$, while curve (c) shows an 80 MHz band obtained by using $F_{vlo}^k=\{260 \text{ MHz}, 280 \text{ MHz}, 300 \text{ MHz}, 320 \text{ MHz}, 340 \text{ MHz}\}$. No additional electronics are required, as this is all accomplished mathematically within the 200 coefficient values in this example, using only the same control electronics that are needed to center the frequency response in a single channel.

Appendix A is a code listing in LISP for a radio receiver implemented in software according to the method described above. For convenience, the parameters are based upon a low cost, 38.4 MHz crystal which provides the basic clock speed. The code uses an input sampling rate of 4.4192 GHz (38.4 MHz times 63), a rotation rate of 115.2 MHz (38.4 MHz times 3), an output frequency of 28.8 MHz (38.4 MHz times 0.75), and a set of 160 SHAs to sample the input signal.

Figure 15:
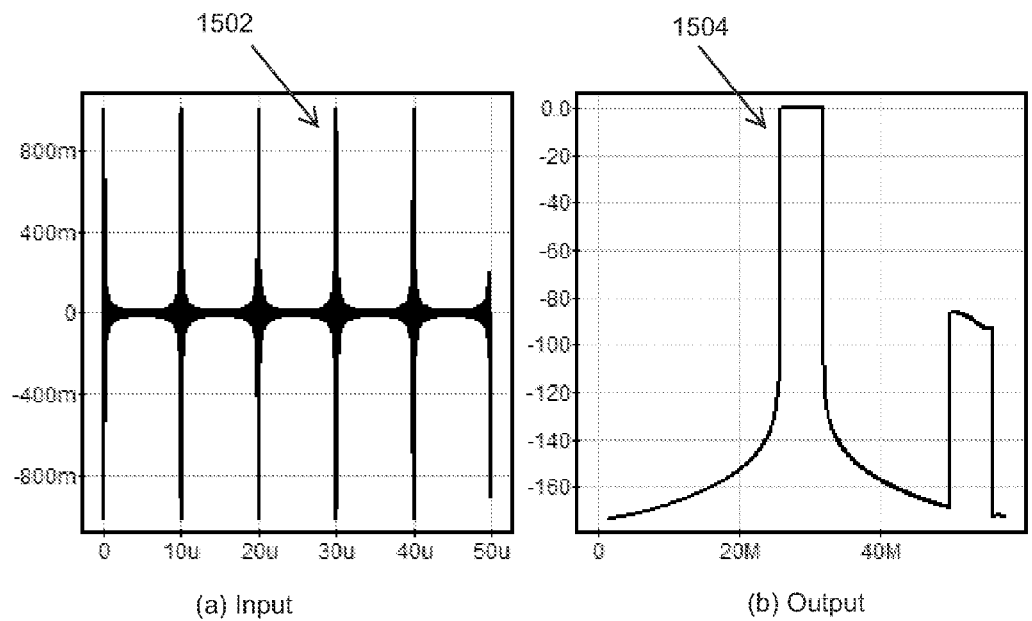
FIG. 15 illustrates an in input signal and output signal in a circuit constructed according to one embodiment.

Tests using this code show results consistent with expectations as described above. FIG. 15 shows the down-conversion of a band from 297 MHz to 303 MHz in which test tones are located 100 KHz apart as shown in curve 1502. The output is shown in curve 1504. As expected, the output is centered around 28.8 MHz with a flat top extending 3 MHz to each side of the center frequency, and drops off steeply from there. There is an artifact in the output signal somewhere around 50 MHz, but this is out of the IF band and more than 80 dB down from the desired signal.

Figure 16:
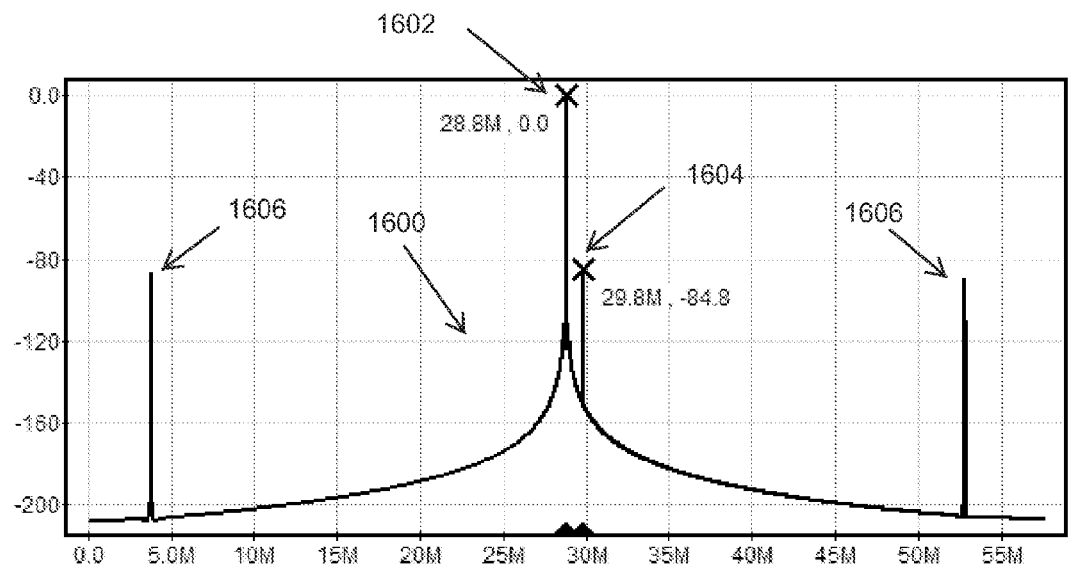
FIG. 16 illustrates the output resulting from a defined input in a circuit constructed according to one embodiment.

FIG. 16 shows the results of another test, one intended to show image rejection. As above, down-converting a desired 300 MHz signal to 28.8 MHz by mixing the 300 MHz signal with a 328.8 MHz local oscillator frequency will also down-convert an undesired image signal of 357.6 MHz to 28.8 MHz. Input signals of 300 MHz and 358.5 MHz were provided (the undesired signal is offset from 357.6 MHz by 0.9 MHz to make the result more visible). Thus, this test provides an unwanted image signal at almost the same frequency as the desired frequency, which is the toughest test of image rejection in a receiver. Curve 1600 in FIG. 16 shows the output from the down-conversion of these signals.

The desired 300 MHz signal is down-converted to 28.8 MHz as expected, as shown by peak 1602. The unwanted 358.5 MHz signal creates an image 1604 at 29.8 MHz (offset by 1 MHz, about what is expected given the offset in the input signal); however, this image 1604 is over −84 dB smaller than the desired signal, or less than 1/100 of a percent of the desired signal in amplitude. There are also other images 1606 on either side of the desired signal, but these are much farther away and again over −80 dB suppressed from the desired signal.

The rejection of the image signal as shown by the absence of a significant peak 1604 is the expected result of the round-robin FIR filter; a virtual filter is applied at the RF input that surrounds only the desired signal and rolls off quickly as the frequency differs from the desired center frequency.

Figure 17:
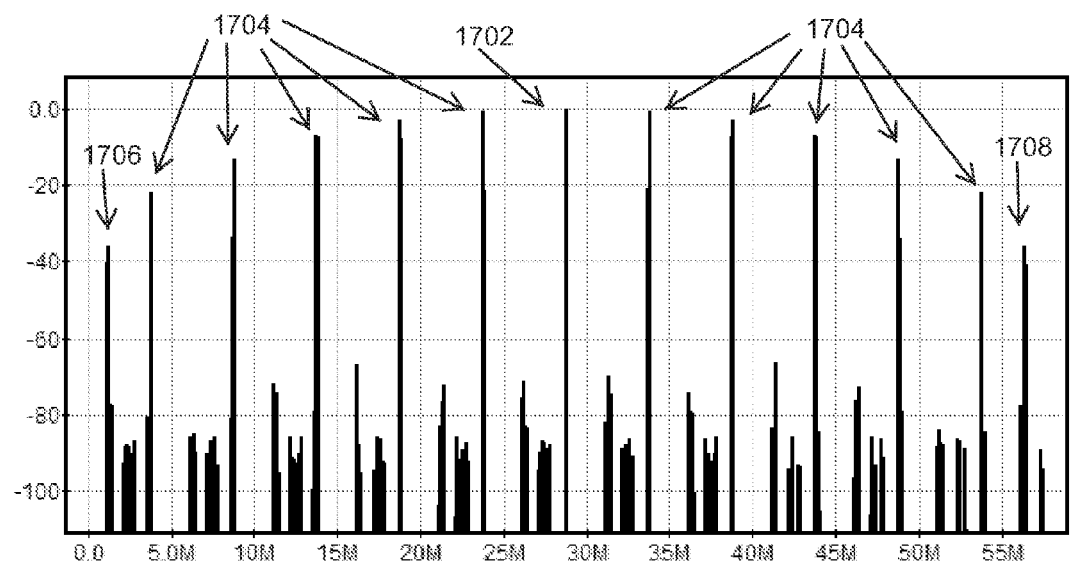
FIG. 17 illustrates the output resulting from another defined input in a circuit constructed according to one embodiment.

FIG. 17 shows the results of another test, in which signals from 200 MHz to 400 MHZ, each 5 MHz apart, are down-converted to a band centered around 28.8 MHz. It will be seen that there is a peak response 1702 at 28.8 MHz, with additional smaller peaks 1704 spaced 5 MHz apart that diminish as they get farther away from 28.8 MHz. Signals other than these are present in the output only at greatly suppressed levels, with a single signal on each side 1704 and 1708 suppressed by approximately −40 dB, and all other signal artifacts suppressed by at least approximately −80 dB.

Figure 18:
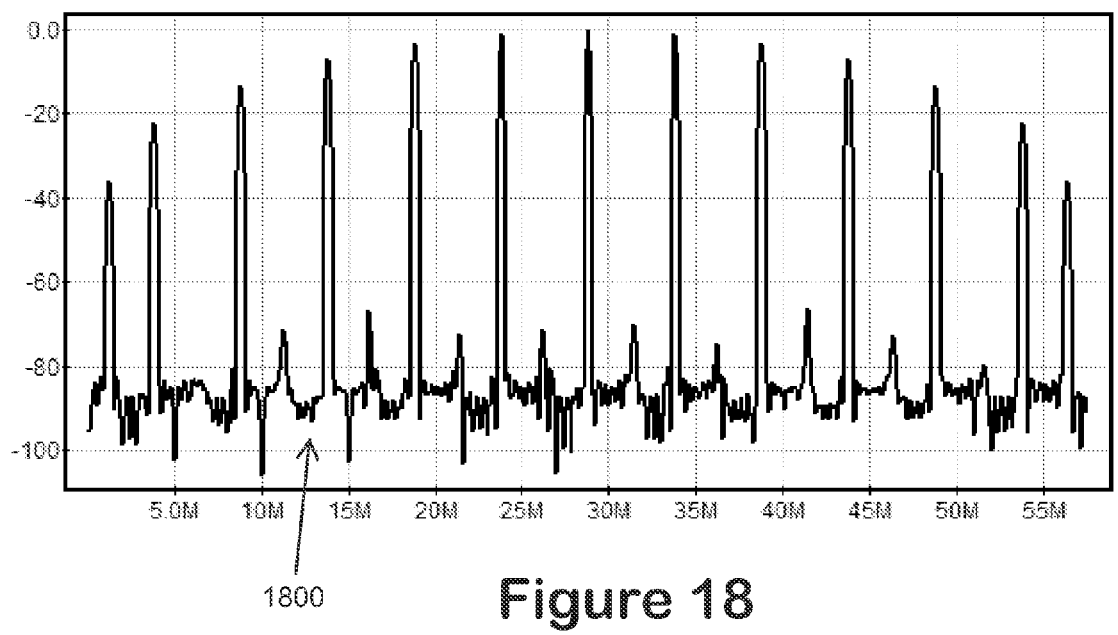
FIG. 18 illustrates the output resulting from still another defined input in a circuit constructed according to one embodiment.

Down-converting a completely full band from 50 MHz to 1 GHz results in the output shown curve 1800 in FIG. 18, which contains a more continuous curve of artifacts, but all still suppressed by −70 dB or more.

Figure 19:
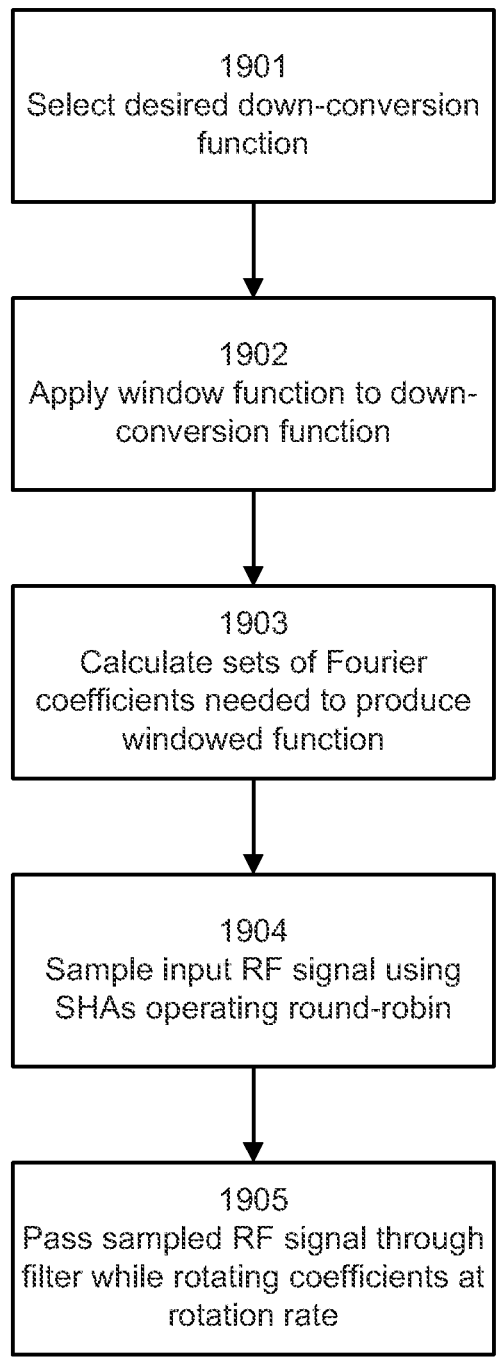
FIG. 19 is a flowchart illustrating one embodiment of a method as described herein.

FIG. 19 is a flowchart of the steps of a method of down-converting a signal as described herein according to one embodiment. At step 1901, the desired down-conversion function is selected, based upon the signal(s) to be down-converted, the desired IF output frequency, the desired bandwidth of the output signal, etc. Since, as above, the function will often not be phase-continuous, at step 1902, a window function is applied to lake it phase-continuous.

At step 1903, the sets of coefficients necessary to produce the desired (and windowed) function are calculated. As described above, this will be based upon the number of SHAs used to sample the input signal, and includes calculating the phase differences required to be added in order to cause the output to be centered around the desired intermediate frequency.

With the coefficients calculated, at step 1904 the input RF signal is sampled by the SHAs in the round-robin method described above. The samples are then passed through the filter at step 1905, while the coefficients are rotated at the rotation rate.

Returning to FIG. 13, as noted above the filter response curve 1300 shows a sharp filter, i.e., a peak response at one frequency, and a rapid and large drop-off in response away from that frequency. This effect, which is a result of the use of the Kaiser window (or other window function to take a set of coefficients phase-continuous), as described above, can be used to make another modification to the system and method described herein.

Suppose the sample rate is 2.4 CS/s. As shown in FIG. 13, which as above has an x-axis as a fraction of the sample rate, the peak response occurs at about 0.03, or 72 MHz (since 0.03×2.4 GHz=72 MHz). If the local oscillator frequency is set to 120 MHz (0.05 on the x-axis), the resulting IF signal will be at the difference of these two frequencies, i.e., 120 MHz−72 MHz=48 MHz.

In addition, an image signal will be created at the sum of these two frequencies, i.e., 120 MHz+72 MHz=192 MHz. However, at this frequency (0.08 on the x-axis), the filter response is −90 dB compared to the response at 72 MHz. Thus, the image signal cannot get through due to the high Q filter, and is negligible.

For this reason, if the image frequency to be rejected is far enough removed from the desired intermediate frequency given the filter response, the Weaver architecture described above is no longer necessary. The image frequency is always 2 times the intermediate frequency away from the desired signal, and the question is thus whether the filter is sufficiently steep to suppress a signal that far away from the center response. One of skill in the art will be able to evaluate the filter response, and whether it is steep enough for the desired purpose in light of the intermediate frequency.

Thus, in such an embodiment, using a circuit such as is shown in FIG. 6, switch 606 and the four sets of coefficients are not needed. Rather, it is sufficient to feed the multipliers 604 a single set of coefficients, since the use of the Kaiser window itself results in a filter response that itself results in the rejection of the image signal, It will be appreciated that this result occurs because of the relationship of the local oscillator frequency, the desired intermediate frequency, and the particular filter that results, which causes the image frequency to be sufficiently far from the peak filter response such that it is substantially suppressed by the filter alone. In other cases, where the local oscillator frequency and the filter peak are too close, the filter response may not be sharp enough to remove the image frequency. In such cases, the Weaver architecture described above will still be useful.

Another advantage to an approach which relies only on the resulting filter to suppress the image signal is that a circuit so constructed can run on a fixed clock, since as described above the use of the window function makes any set of coefficients phase-continuous, and it is thus unnecessary to consider the relationship between the local oscillator frequency and the clock. Again, the center frequency of the filter may be off-center compared to the received frequency, but as above this can be corrected by changing the phase of the windowed coefficients appropriately.

Further, in this embodiment, it is still possible to use any superposition of solutions to shape the received signal to a flat-top response or any other desired response shape as in FIGS. 14 and 15, and to receive multiple frequency bands simultaneously, with a different filter shape and gain for each. Also, the method shown in FIG. 19 is still applicable, with the exception of step 1905, the rotation of coefficients, which may be omitted when the filter provides sufficient suppression of the image signal.

In practice, in some embodiments the received signal will be sampled and the additional steps calculating the coefficients and multiplying, filtering and summing the samples will be performed by a processor or computing device, for example, a general purpose computer running digital signal processing software. All such embodiments that perform the described steps are within the scope of this application.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

For example, as is well understood by those of skill in the art, other window functions than the Kaiser window may be used. Various types of SHA circuits are available, as are various types of clocks.

It should also be appreciated that the described method and apparatus can be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (DVD), flash memory, etc. The methods may also be incorporated into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

APPENDIX A

LISP CODE MODEL

```
;;;;;;;;;;;;;;;;;;;;;;;;;;;;;;;;;;;;;;;;;;;;;;;;;;;;;;
;;;; A Direct and Simple Enigma Radio - DSER
;;;;;;;;;;;;;;;;;;;;;;;;;;;;;;;;;;;;;;;;;;;;;;;;;;;;;;
;;
;; Terms:
;;    input sampling rate - ISR
;;        the rate at which samples are taken of the RF signal
;;        such as 2.4Ghz or more.
;;
;;    output rotation rate - ORR
;;        the equivalent rotation rate of the under-sampled
;;        convolution sum. (This is the phase change of the
;;        coefficients prior to multiplication by the window).
```

APPENDIX A-continued

LISP CODE MODEL

```
;;
;;      output sampling rate - OSR
;;           the rate at which samples of the output are taken
;;
;;      output sub-sample - OSS
;;           the division of the ISR that makes the OSR
;;
;;----------------------------------------------------------
;;
;; Filter the RF signal in the samplers, but then take data
;; from them at a lower rate. In taking the data from the
;; array, shift the phase as we go. The sub-samples creates images,
;; the filter does two things: it selects the particular multiple
;; and it removes the image...
;;
;; For example, to make a USA format (44Mhz IF) TV/radio,
;; an array of samplers (eg 96 elements, is sampled (ISR)
;; at (ie) 2.4Ghz. At a rate of (eg) 200Mhz (1/12 the input
;; sampling rate OSS), the output convolution is sampled (OSR).
;; To receive (ie) 100Mhz, center the filter on 100Mhz and
;; set the output equivalent rotation rate (ORR) to 56Mhz.
;;;-------------------------------------------------------
;;; April 24th 2011.
;;; It appears to be inconvenient to change the DAC codes
;;; at say 200Mhz. Instead try to much slow down the
;;; output sample. Choose 38.4M * 3 = 115.2Mhz and generate
;;; from third harmonic Enigma on common 38.4Mhz xtal.
;;; In this case we can sample up to 57.6Mhz, lets choose
;;; 54M as the highest. Hence the low side of the IF can
;;; be 46Mhz.
;;; I find that a 160 tap filter can be -60db down
;;; in about 42M when sampled at 2.4Ghz, so the hold
;;; time of any given sample is (/ 160 2.4G) = 66.67n
;;;-------------------------------------------------------
;;; Ok now try to build something:
(defparameter *dser-design* '((38p4Mhzx3Clk    :length 160      ;; This is a small database of design targets
                                               :isr (* 21 38.4M 3)
                                               :oss 21
                                               :cin 5.5p
                                               :cout 100p
                                               :fop (* 38.4M 3)
                                               :fif (* 38.4M 3 1/4)
                                               :zin 75
                                               :alpha 2.7))
(defvar *window-values* nil)
(defun get-dser (key &optional (design '38p4Mhzx3Clk))          ;; Utility function to get design targets
     (getf (cdr (member design *dser-design*)) key))
(defun window-values (&key (length (get-dser :length))          ;; Gets the Kaiser window
                           (alpha (get-dser :alpha)))
     (or (cdr (find (cons length alpha) *window-values* :test #'equal :key #'car))
         (let ((values
                  (loop
                       with wf = (make-windower length :kaiser :alpha alpha)
                       for i below length
                       collect (funcall wf i))))
              (push (cons (cons length alpha) values) *window-values*)
              values)))
(defun coeff-values (&optional                                  ;; Creates the coefficient values
                           (fcenter 100M)
                           (phase 0)
                           &key
                           (dt (/ (get-dser :isr)))
                           (length (get-dser :length))
                           (alpha (get-dser :alpha)))
     (loop
          for w in (window-values :length length :alpha alpha)
          for time by dt
          collect (* w (sin (+ phase (* 2 pi fcenter time))))))
(defun model0 (&optional (fin 75M)                              ;; Models the operation of the DSER
                           (fcenter fin)
                           (frot 1M)
                           &key
                           (run-time 10u)
                           (oss (get-dser :oss))
                           (dt (/ (get-dser :isr)))
                           (fop (get-dser :fop))
                           (length (get-dser :length)))
```

APPENDIX A-continued

LISP CODE MODEL

```
        (let ((sample-caps (make-array length :initial-element 0))      ;; The SHA's
              (dacs (make-array length :initial-element 0))             ;; The Coefficient values
              (out nil)
              (outb nil)
              (dphase (* 2 pi (/ frot fop)))                            ;; Additional phase change
              (phase 0))
    (loop
        for i from 0
        for time from (* -2 length dt) by dt below run-time             ;; Simulation state machine at Fsam
        as input = (sin (* 2 pi fin time)                               ;; Example input signal
        do (setf (aref sample-caps (mod i length)) input)               ;; Round-robin sample into SHA's
        when (zerop (mod i oss))                                        ;; Events at rotation rate...
        do (loop
                for j from 0
                for c in (coeff-values fcenter (incf phase dphase) :dt dt :length length)
                as val = (* (+ c 1) 0.5)                                ;; DAC (coefficient values) are all positive
                do (setf (aref dacs (mod (+ i j) length)) val))
        (when (>= time 0)                                               ;; Events at rotation rate after initial
impulse
            (loop
                for dac across dacs
                for sam across sample-caps
                as vs = (- input sam)
                sum (* vs dac) into outs                                ;; note the model of unipolar dac
                sum (* vs (- 1 dac)) into outbs
                finally (push outs out) (push outbs outb)))
        finally
            (plot (loop                                                 ;; Post processing analysis functions
                        for a in out
                        for b in outb
                        collect (- a b) into c
                        finally (return (reverse c)))
                    (* dt oss)
                    "DSER"
                    :pre-process 'fft-dft-blackman
                    :contour-names (real-to-eng fin)))))
;;;; And this is how to set the model for any received frequency:
(defun run-model0 (&optional (fin 300M) (if (get-dser :fif)) (fop (get-dser :fop)))
    (when (< 50M fin 1G)
        (let ((flo (loop
                        for i from 0 below 8
                        as flo = (+ if (- fin (* i fop)))
                        when (<= (* 0.5 fop) flo (* 1.5 fop))
                        return (- flo fop))))
            (format t "~%For ~uHz and IF ~u, Flo is ~u" fin if flo)
            (model0 fin fin flo))))
```

What is claimed is:

1. A computer implemented method of down-converting an input signal from a first frequency band to a second frequency band, comprising:
   receiving in a processor a selected transfer function for converting the signal from the first frequency band to the second frequency band, the transfer function including a center frequency of the second frequency band;
   receiving in the processor a sequential series of samples of the input signal at a fixed interval from an array of sampling circuits;
   determining in the processor a plurality of sets of scaling factors, each set of scaling factors corresponding to coefficients in a Fourier series approximation of the selected transfer function and containing a different phase adjustment from the other sets of scaling factors;
   successively multiplying in the processor each of the samples of the input signal by the plurality of sets of scaling factors by rotating between the plurality of sets of scaling factors at the rate at which the samples of the input signal are received, each multiplication resulting in an interim output; and
   summing in the processor the interim outputs of the multiplications to create the output signal in the second frequency band.

2. The method of claim 1, wherein determining the plurality of sets of scaling factors further comprises mathematically calculating the Fourier coefficients.

3. The method of claim 1, wherein determining the plurality of sets of scaling factors further comprises determining the Fourier coefficients by an iterative method.

4. The method of claim 3, wherein determining the Fourier coefficients by an iterative method further comprises determining the Fourier coefficients by a Parks-McClellan method.

5. The method of claim 1 further comprising, in the processor, passing the series of samples through a filter before multiplying the samples by the plurality of sets of scaling factors.

6. The method of claim 5, wherein the filter is a band-pass filter.

7. The method of claim 5, wherein the filter is a low-pass filter.

8. The method of claim 1, further comprising multiplying in the processor one of the plurality of sets of scaling factors by a window function.

9. The method of claim 8, wherein the window function is a Kaiser window function.

10. The method of claim 9, wherein the Kaiser window function is parameterized to $\alpha=2.7$.

11. A circuit for down-converting an input signal from a first frequency band to a second frequency band, comprising:
   an array of N sampling circuits for sampling the input signal in response to a timing signal, the array configured such that the sampling circuits in the array create samples of the input signal in time-delayed sequence at a fixed interval and each individual sampling circuit operates at a rate of the interval between samples times N;
   a processor for multiplying the samples by a plurality of sets of scaling factors by rotating between the plurality of sets of scaling factors at the rate at which each individual sampling circuit operates, each multiplication creating an interim output, each set of scaling factors corresponding to coefficients in a Fourier series approximation of a desired transfer function and containing a phase adjustment different from each other set of scaling factors such that if the scaling factors are multiplied by a window function and an input signal multiplied by concatenated sets of windowed scaling factors, the resulting output signal will be centered at a center frequency of the second frequency band; and
   a summer for summing the interim outputs of the multiplications.

12. The circuit of claim 11, further comprising a filter for filtering the samples of the input signal.

13. The circuit of claim 12, wherein the filter is a band-pass filter.

14. The circuit of claim 12, wherein the filter is a low-pass filter.

15. A non-transitory computer readable storage medium having embodied thereon instructions for causing a computing device to execute a method of designing a filter for down-converting an input signal from a first frequency band to a second frequency band, the method comprising: receiving in a processor a selected transfer function for converting the signal from the first frequency band to the second frequency band, including a center frequency of the second frequency band;
   receiving in the processor a sequential series of samples of the input signal from an array of sampling circuits for sampling the input signal in response to a timing signal, the array configured such that the sampling circuits create samples of the input signal in time-delayed sequence at a fixed interval, and wherein each individual sampling circuit operates at a rate of the interval between samples times the number of sampling circuits;
   determining in the processor a plurality of sets of scaling factors, each set of scaling factors corresponding to coefficients in a Fourier series approximation of the selected transfer function and containing a different phase adjustment from the other sets of scaling factors such that when the sequential samples of the input signal are multiplied by rotating sets of the plurality of sets of scaling factors a resulting output signal is centered at the center frequency of the second frequency band;
   successively multiplying in the processor each of the samples of the input signal by the plurality of sets of scaling factors by rotating between the plurality of sets of scaling factors at the rate of operation of the individual sampling circuits, each multiplication resulting in an interim output; and
   summing in the processor the interim outputs of the multiplications to create the output signal in the second frequency band.

16. A computer implemented method of concurrently down-converting two channels of information from an input signal in a first frequency band to selected portions of a second frequency band, comprising:
   receiving in a processor a first selected transfer function and a second selected transfer function, the first selected transfer function for down-converting a first channel from the first frequency band to a first portion of the second frequency band, and the second selected transfer function for down-converting a second channel from the first frequency band to a second portion of the second frequency band;
   determining in the processor a first plurality of sets of scaling factors representing the first transfer function and a second plurality of sets of scaling factors representing the second transfer function;
   receiving a sequential series of samples of the input signal from an array of sampling circuits for sampling the input signal in response to a timing signal, the array configured such that the sampling circuits create samples of the input signal in a time-delayed sequence at a interval, and wherein each individual sampling circuit operates at a rate of the interval between samples times the number of sampling circuits;
   successively multiplying in the processor each of the samples of the input signal by the first plurality of sets of scaling factors by rotating between each of the first plurality of sets of scaling factors, each multiplication resulting in an interim output;
   successively multiplying in the processor each of the samples of the input signal by the second plurality of sets of scaling factors by rotating between each of the second plurality of sets of scaling factors, each multiplication resulting in an interim output;
   summing in the processor the interim outputs of the multiplications by the first plurality of sets of scaling factors to create a first output signal in the first portion of the second frequency band; and
   summing in the processor the interim outputs of the multiplications by the second plurality of sets of scaling factors to create a second output signal in the second portion of the second frequency band.

17. The method of claim 16 wherein the first transfer function includes a center frequency of the first portion of the second frequency band, and the second transfer function includes a center frequency of the second portion of the second frequency band.

18. The method of claim 17 wherein determining in the processor a first plurality of sets of scaling factors representing the first transfer function and a second plurality of sets of scaling factors representing the second transfer function further comprises determining the plurality of sets of scaling factors such that:
   each set of the first plurality of sets of scaling factors corresponds to coefficients in a Fourier series approximation of the first selected transfer function and contains a different phase adjustment than the other sets in the first plurality of sets such that when the sequential samples of the input signal are multiplied by successive sets of the first plurality of sets of scaling factors a resulting output signal will be centered at the center frequency of the first portion of the second frequency band; and
   each set of the second plurality of sets of scaling factors corresponds to coefficients in a Fourier series approximation of the second selected transfer function and contains a different phase adjustment than the other sets in the second plurality of sets such that when the sequential samples of the input signal are multiplied by successive sets of the second plurality of sets of scaling factors a resulting output signal will be centered at the center frequency of the second portion of the second frequency band.

19. The method of claim 18 wherein successively multiplying in the processor each of the samples of the input signal by the first plurality of sets of scaling factors and concurrently successively multiplying in the processor each of the samples of the input signal by the second plurality of sets of scaling factors further comprises rotating between each of the first plurality of sets of scaling factors and each of the second plurality of scaling factors at the rate of operation of the individual sampling circuits.

* * * * *